United States Patent
Ostholt et al.

(10) Patent No.: US 11,377,387 B1
(45) Date of Patent: Jul. 5, 2022

(54) METHOD FOR PRODUCING MICROSTRUCTURES IN A GLASS SUBSTRATE

(71) Applicants: LPKF Laser & Electronics AG, Garbsen (DE); Roman Ostholt, Langenhagen (DE); Norbert Ambrosius, Garbsen (DE)

(72) Inventors: Roman Ostholt, Langenhagen (DE); Norbert Ambrosius, Garbsen (DE)

(73) Assignee: LPKF LASER & ELECTRONICS AG, Garbsen (DE)

( * ) Notice: Subject to any disclaimer, the term of this patent is extended or adjusted under 35 U.S.C. 154(b) by 0 days.

(21) Appl. No.: 17/608,996

(22) PCT Filed: Apr. 23, 2020

(86) PCT No.: PCT/DE2020/100333
§ 371 (c)(1),
(2) Date: Nov. 5, 2021

(87) PCT Pub. No.: WO2020/224706
PCT Pub. Date: Nov. 12, 2020

(30) Foreign Application Priority Data

May 6, 2019 (DE) .................... 10 2019 111 634.1

(51) Int. Cl.
*C03C 15/00* (2006.01)
*C03C 23/00* (2006.01)
(Continued)

(52) U.S. Cl.
CPC ............ *C03C 15/00* (2013.01); *B23K 26/364* (2015.10); *C03C 23/0025* (2013.01);
(Continued)

(58) Field of Classification Search
CPC .............. B23K 26/364; B81C 1/00587; B81C 2201/0132; C03C 15/00; C03C 23/0025
See application file for complete search history.

(56) References Cited

U.S. PATENT DOCUMENTS

2014/0231390 A1* 8/2014 Nukaga ................. B23K 26/53
216/94
2016/0059359 A1* 3/2016 Krueger ............. B23K 26/0006
65/158
(Continued)

FOREIGN PATENT DOCUMENTS

DE 102013103370 A1 10/2014
DE 102014113339 A1 3/2016
(Continued)

*Primary Examiner* — Binh X Tran
(74) *Attorney, Agent, or Firm* — Leydig, Voit & Mayer, Ltd.

(57) ABSTRACT

A method for producing microstructures includes introducing modifications by a laser beam into a volume between two opposite outer surfaces of a glass substrate. An etching method is carried out which provides anisotropic material removal in one of the outer surfaces so as to produce recesses that have a conical shape. A layer that is resistant to an etching effect of the etching method is applied as a cover layer to only one outer surface. Then, a further etching method is carried out so that material is removed in the other outer surface until recesses of this other outer surface, which are produced and/or enlarged by the further etching method, have reached the cover layer.

14 Claims, 3 Drawing Sheets

(51) Int. Cl.
 *B23K 26/364* (2014.01)
 *B23K 103/00* (2006.01)
 *B81C 1/00* (2006.01)

(52) U.S. Cl.
 CPC ...... *B23K 2103/54* (2018.08); *B81C 1/00158* (2013.01); *B81C 1/00587* (2013.01); *B81C 2201/0132* (2013.01); *B81C 2201/0143* (2013.01)

(56) References Cited

U.S. PATENT DOCUMENTS

| | | | |
|---|---|---|---|
| 2017/0094768 A1 | 3/2017 | Adams et al. | |
| 2018/0037489 A1* | 2/2018 | Ono | B23K 26/402 |
| 2018/0093881 A1 | 4/2018 | Chiou et al. | |
| 2018/0340262 A1* | 11/2018 | Hiranuma | C23F 1/16 |
| 2019/0193205 A1* | 6/2019 | Sekiya | B23K 26/362 |
| 2020/0009691 A1 | 1/2020 | Ostholt et al. | |

FOREIGN PATENT DOCUMENTS

| | | |
|---|---|---|
| DE | 102017216418 A1 | 4/2018 |
| EP | 2503859 A1 | 9/2012 |
| WO | WO 2018162385 A1 | 9/2018 |

\* cited by examiner

METHOD FOR PRODUCING MICROSTRUCTURES IN A GLASS SUBSTRATE

CROSS-REFERENCE TO PRIOR APPLICATIONS

This application is a U.S. National Phase application under 35 U.S.C. § 371 of International Application No. PCT/DE2020/100333, filed on Apr. 23, 2020, and claims benefit to German Patent Application No. DE 10 2019 111 634.1, filed on May 6, 2019. The International Application was published in German on Nov. 12, 2020 as WO 2020/224706 A1 under PCT Article 21(2).

FIELD

The invention relates to a method for producing microstructures in a glass substrate, which are introduced through outer surfaces opposite one another, wherein modifications are initially introduced into at least one outer surface by means of laser radiation, and the microstructures are subsequently produced by means of an etching method by means of anisotropic material removal through a plurality of recesses, in particular recesses that are cone-shaped at least in sections, in the at least one outer surface of the glass substrate.

With this method, a laser beam of the laser radiation is briefly directed onto the glass substrate in such a way that the glass substrate is only modified along a beam axis of the laser beam, without giving rise to a destruction penetrating the glass substrate. In the next step, anisotropic material removal is limited to those regions of the glass substrate that previously underwent modification by means of the laser beam. This results in a recess or aperture in the glass substrate.

A chemical conversion of the substrate material occurs due to the action of the laser during the modification, which has only little effects on the physical properties or the external condition of the substrate. In particular, no or only extremely small material removal occurs on the surface of the substrate due to the action of the laser. The laser energy input can thereby be limited to a few pulses or a single pulse since it serves only to excite or trigger a reaction and a modification by conversion, the effect of which is only used in the subsequent method step to remove the desired material.

BACKGROUND

The generic method for precision processing of glass by means of laser-induced deep etching has become known under the designation LIDE (laser-induced deep etching). The LIDE method makes it possible to introduce precise recesses and structures at the highest speed and thus creates the prerequisites for the increased use of glass as a material in microsystem technology. LIDE technology makes it possible for the first time to realize modifications over the entire glass thickness with individual laser pulses. This is the basis for producing deep structures, such as through-holes or microsections.

DE 10 2013 103 370 A1 relates to such a method for introducing a plurality of apertures by means of a laser beam into a glass substrate that can be used as an interposer.

DE 10 2014 113 339 A1 discloses a method for producing recesses by means of a laser beam within transparent or transmissive materials. For each recess, a filament is produced by alternately self-focusing and defocusing laser pulses in the transparent material, whereby linear chains of modifications or channel-modified material having a substantially constant diameter are produced. By subjecting the material to anisotropic material removal, for example an etching method, at least in its modified regions, recesses or apertures are produced in the material instead of the filaments.

It is also already known to in this way create bridging structures, which as a membrane form the basis for micromechanical systems, for example pressure sensing devices or microphones.

Moreover, a controlled removal for reducing the layer thickness up to the desired residual thickness can also be achieved by deep reactive ion etching (DRIE).

DE 10 2017 216 418 A1 relates to a pressure sensing device with an elongated flat polygonal cavity, in particular to a pressure sensing device based on a micromechanical system (MEMS).

Furthermore, EP 2 503 859 A1 describes a substrate that has a through-opening that connects the first and second main surfaces of the substrate and that is filled with a conductor. In a vertical cross-section of the substrate, the through-hole has a trapezoidal shape.

SUMMARY

In an embodiment, the present invention provides a method for producing microstructures in a glass substrate. Modifications are introduced by a laser beam into at least one volume between two opposite outer surfaces of the glass substrate. After introducing the modifications, an etching method is carried out which provides anisotropic material removal in at least one of the two outer surfaces so as to produce a plurality of recesses that are cone-shaped at least in sections. After carrying out the etching method, a layer that is resistant to an etching effect of the etching method is applied as a cover layer in a region that includes at least individual ones of the recesses to only one of the two outer surfaces as a first outer surface. After applying the layer that is resistant to the etching effect of the etching method, a further etching method of the glass substrate is carried out so that material is removed in the other one of the two outer surfaces as a second outer surface facing away from the cover layer until recesses of the second outer surface, which are produced by the further etching method and/or are produced by the etching method and are enlarged by the further etching method, have reached the cover layer.

BRIEF DESCRIPTION OF THE DRAWINGS

Subject matter of the present disclosure will be described in even greater detail below based on the exemplary drawings. The drawing shows in each case a schematic representation in cross-section. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
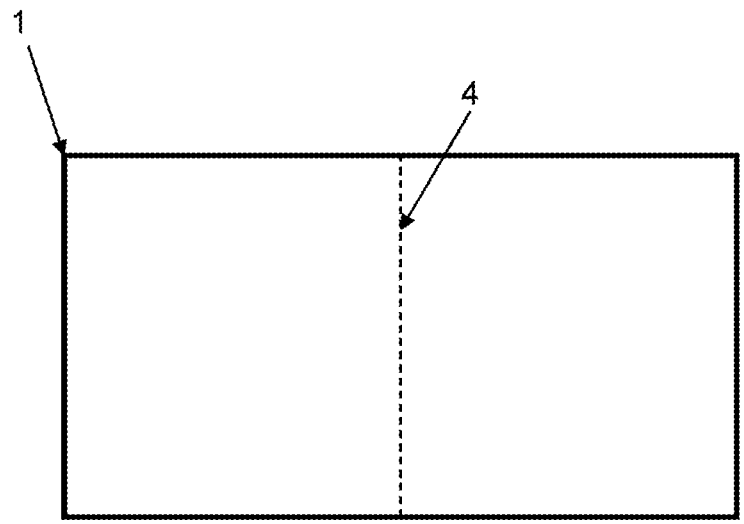
FIG. 1 shows a glass substrate after a laser modification continuous between opposite outer surfaces.

In an embodiment, the present invention provides a further improved production method for microstructures, in particular complex microstructures as well.

According to an embodiment of the invention, a layer resistant to the etching effect of the etching method is applied in a region including at least individual recesses to only one of the two outer surfaces as a first outer surface in the form of a contoured, non-planar cover layer, and thereafter, the etching method is continued or a further etching method of the glass substrate is carried out so that material is removed in the form of further recesses in the second outer surface facing away from the cover layer until the recesses of the second outer surface have reached the cover layer and the cover layer is exposed in the respective recess and is accessible through the second recess. According to an embodiment of the invention, the possibility for producing a three-dimensional cover layer bridging the recesses is thus achieved for the first time. For this purpose, recesses opposite one another in the two outer surfaces of the glass substrate are initially introduced in at least one of the two outer surfaces, preferably in both outer surfaces, by a modification known per se and subsequent anisotropic etching. The structure created in this way, with recesses introduced regularly, for example according to a predetermined pattern, or irregularly, the shape, orientation, and size of which are determined by the type of modifications introduced and can be adjusted differently for different recesses, forms the basis for the cover layer to be applied. On the one hand, this cover layer fulfills the function of an etch resist to protect against further etching removal in the case of a subsequent etching treatment, but, on the other hand, requirements for the product to be produced from the glass substrate as well. With a simple shape of the material removal, regular cone-shaped recesses are produced. The cover layer applied thereto also assumes this contour. The desired overhang structure subsequently arises in that the anisotropic material removal starting from the second outer surface facing away from the cover layer is continued until it ultimately reaches the cover layer and is thus also accessible from the second outer surface. Etching is ended when the lower side of the cover layer exposed by the recess in the second outer surface is of the desired size by widening the recess. For the first time, this results in a glass substrate with overhang structures that, on the one hand, have almost any contour or topography and, on the other hand, simultaneously serve as a separating or boundary surface of the recess, wherein the cover layer can have properties adapted to the respective intended purpose.

According to a preferred variant of the method, the second outer surface is removed by etching in such a way that the cover layer of the first outer surface projects from the remaining plane of the second outer surface. Thus, by not ending but continuing the etching process when the cover layer of the first outer surface is reached, a flat material removal occurs at the second outer surface, as a result of which the material thickness of the glass substrate is reduced. It is easy to understand that the etching process can be adjusted in such a way that the remaining material thickness is less than the extension of the cover layer into the recess so that as a result, the tip of the cover layer lies in the same plane as or projects from the second outer surface. This results in a pattern of spaced projections of the cover layer in the glass substrate, which projections can as a result be optimally used for contacting, in particular, even complex electrical microstructures.

Although a variant in which the glass substrate is completely dissolved by the etching effect so that only the cover layer is maintained, is conceivable, it has nevertheless proven to be expedient if the projections of the cover layer reaching into the recesses are separated, in particular also electrically insulated, by regions of the glass substrate.

Preferably, the cover layer can, for example, have good electrically conductive properties so that the recesses in the second outer surface can be used, for example, as a sample container, the bottom surface of which is formed by the cover layer as an electrical contact. As a result, the glass substrate is also suitable as a sensor for determining specific properties of a substance in the recess.

Another likewise particularly promising embodiment of the method according to the invention is achieved in that the second outer surface is also provided with a cover layer, wherein the cover layer is applied to the second outer surface in a particularly preferred manner after the recesses in the second outer surface have reached the cover layer of the first outer surface as a result of the progressive material removal. By applying the second cover layer to the second outer surface while keeping open the recesses already previously introduced, the further material removal is limited to the inner wall surfaces of the recesses, while the regions of the second outer surface between the recesses are optimally protected from further material removal by the second cover layer. In this way, the shape and form of the recesses, in particular the aspect ratio of the recesses, can be adjusted in the desired manner.

In a particularly advantageous manner, the cone angle of the recesses is adjusted by the cover layer of the second recess and/or the laser parameters, wherein the cover layer of the second outer surface can be applied after an interruption to the etching process, and the cone angle, in particular in the axial direction of the modification as well, can be adjusted differently by the remaining residual duration of the etching process in relation to the preceding etching duration. The cone angle can be adjusted by repeated modifications at a very small distance from a previous modification.

It is obvious that the cover layer does not have to be applied to the entire first and/or second outer surface but can also be limited to subregions. Furthermore, the material properties of the cover layer may also vary in different regions of the outer surface or may have a different layer thickness.

A further particularly practical embodiment of the method according to the invention is achieved in that the modifications are introduced into both outer surfaces from one side by means of a plurality of laser beams respectively connecting the two outer surfaces. By thus introducing the recesses by modifications along the beam axis of the laser radiation connecting the two outer surfaces, the recesses resulting therefrom during the subsequent etching process are coaxial. A cone-shaped or conical cover layer of the recess of the first outer surface is thus centered in the opposite recess of the second outer surface.

Although the beam axis of the modifications and the correspondingly subsequently produced recesses are introduced with their central axis preferably perpendicular to the respective surface, different angular positions can also be adjusted differently so that the axes of the recesses are arranged at an incline with respect to the cover layer.

The energy input takes place by means of a laser radiation into the glass substrate in such a way that the focus of the laser radiation undergoes a spatial beam shaping along a beam axis of the laser radiation. This results in spatially stretched modifications in the glass substrate along the beam axis, which, during the subsequent action of an etching medium and by successive etching, produce the desired microstructures in the glass substrate as a result of anisotropic material removal in the respective region of the modifications. In order to not expose the glass substrate to an abrupt energy input as a result of which other properties of the glass substrate could be changed undesirably, the modifications can also be produced by groups of individual pulses, the time interval of which within the same groups is, for example, less than 1 µs, wherein the time interval between two successive groups is a multiple of the time interval between the individual pulses. The desired modifications are produced by accumulating the intensities of the individual pulses of a respective group, wherein the focus of the laser radiation is unchanged with respect to the glass substrate for the duration of each group.

In addition to the protective effect with respect to the etching attack, the cover layer applied to the first and/or second outer surfaces can also have the essential properties for the product to be produced. According to a preferred embodiment, at least one cover layer can be reinforced with an additional functional layer, which can have particular electrical properties, for example.

The products that can be produced by means of the method according to embodiments of the invention are quite varied and cannot be enumerated comprehensively. In addition to sensors and contacting elements, the method is also suitable, for example, for electron emitters if an electrical voltage is applied between the opposite cover layers.

The invention permits various embodiments. For further clarification of its basic principle, one of them is shown in the drawing and is described below. The drawing shows in each case in a schematic diagram in a cross-section in The method according to an embodiment of the invention for producing microstructures in a glass substrate 1 is explained in more detail below with reference to FIGS. 1 to 6, wherein only a small section of the glass substrate 1 is shown for better understanding. A laser modification 4 continuous between opposite outer surfaces 2, 3 is initially introduced into the glass substrate 1.

Figure 2:
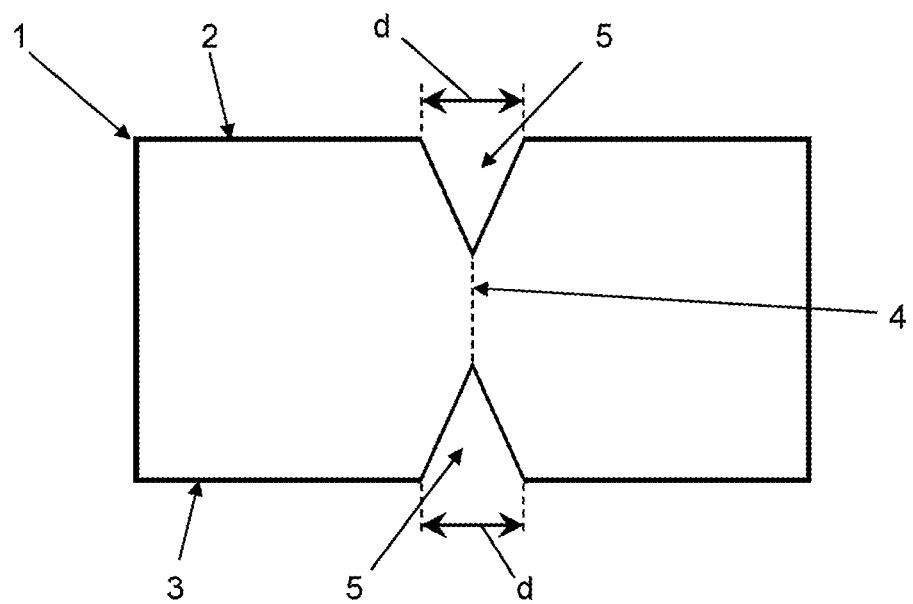
FIG. 2 shows the glass substrate with cone-shaped recesses after an etching process on both sides.

As a result of anisotropic material removal brought about by a subsequent etching method, a plurality of cone-shaped recesses 5 shown in FIG. 2 are produced in the glass substrate 1.

Figure 3:
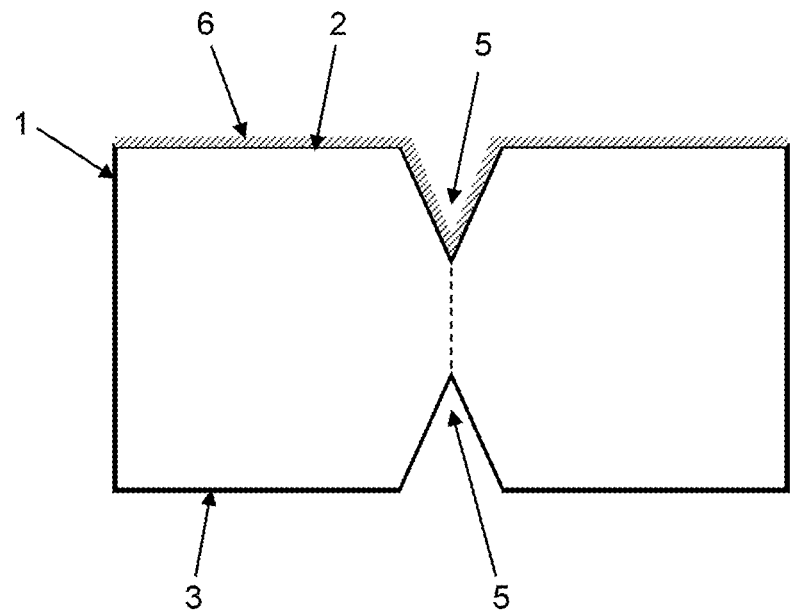
FIG. 3 shows the glass substrate with a coating on a first outer surface.

As soon as the recesses 5 of the desired size d have been produced, the etching process is interrupted and a cover layer 6, which is resistant to the etching attack and is designed here as a metal layer, is applied to the upper, first outer surface 2. As can be seen, the cover layer 6 follows the previously introduced contour of the outer surface 2 and thus forms concave, cone-shaped depressions in the region of the recesses 5 between an otherwise flat course of the first outer surface 2, as can be seen in FIG. 3.

Figure 4:
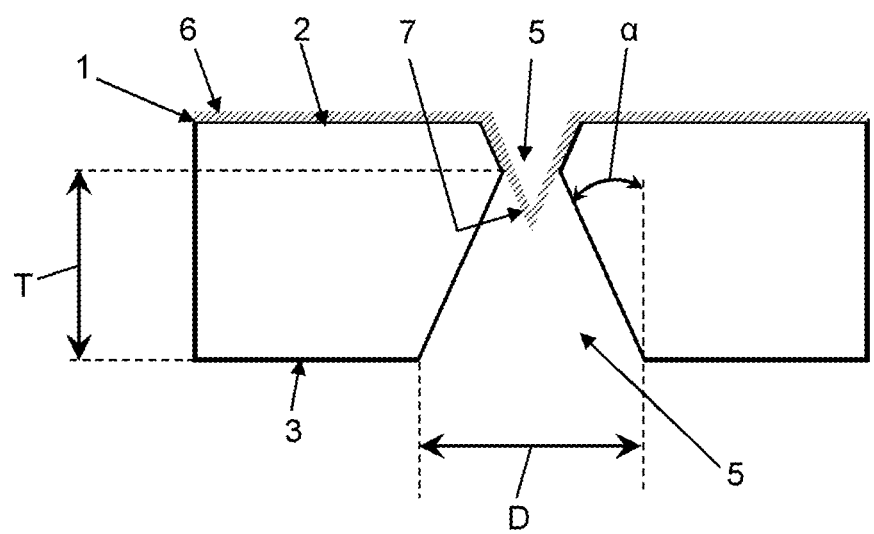
FIG. 4 shows the glass substrate with a recess enlarged on one side after a further etching process.

Subsequently, the glass substrate 1 coated in this way is further etched, resulting in further material removal in the recess 5 and an increasing size D of this recess 5 at the second outer surface 3 facing away from the cover layer 6, while the first outer surface 2 protected by the cover layer 6 as an etch resist is maintained without any change. The progressive material removal results in a depression T of the recess 5 until it has ultimately reached a rear side 7 of the cover layer 6 and the etching process is ended, as shown in FIG. 4. According to an embodiment of the invention, the cover layer 6 bridging the recesses 5 thereby obtains a three-dimensionally contoured texture, which follows a microstructure that is in particular regular. In that the cover layer 6 projects into the recesses 5 of the second outer surface 3, the structure thus created can be used, for example, as a sensor, wherein the recess 5 receives a sample of a sub stance.

Figure 5:
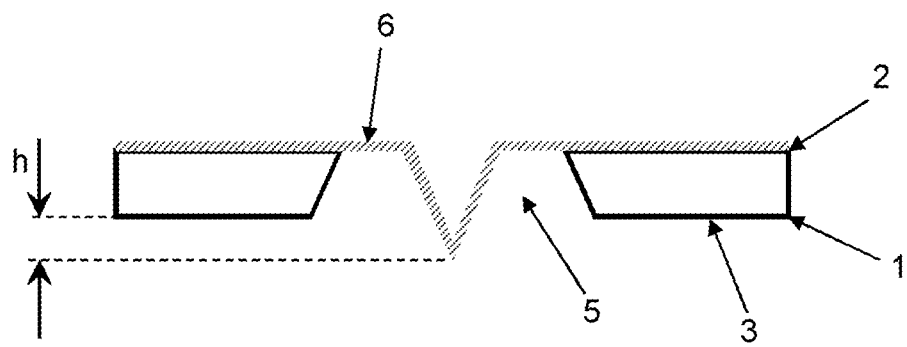
FIG. 5 shows the glass substrate with a reduced material thickness as a result of a continued etching process.

However, the etching process can also be continued further, as illustrated in FIG. 5. As a result of the continued material removal, a significant reduction in the material thickness of the glass substrate 1 is achieved until the contoured cover layer 6 ultimately projects with a height h from the plane of the second outer surface 3. The cone-shaped regions of the cover layer 6 form protruding contact points with their cone tips, for example for circuit carriers, by which a significant simplification of the contacting of such circuit carriers can be achieved.

Figure 6:
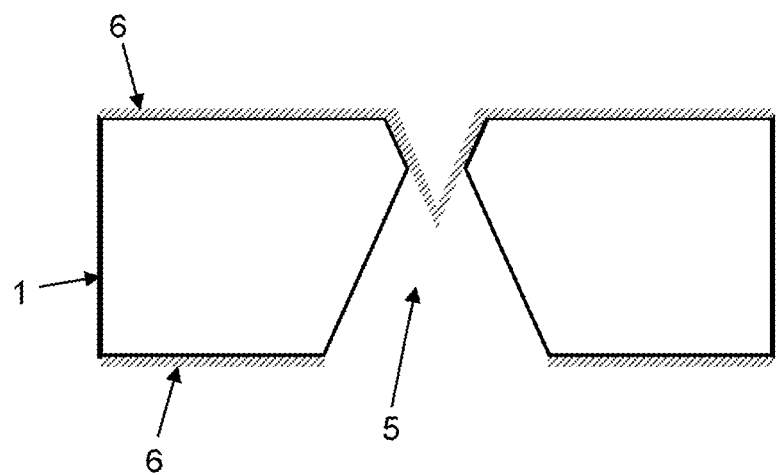
FIG. 6 shows the glass substrate with a further coating applied to the second outer surface.

Furthermore, in a variant shown in FIG. 6, the second outer surface 3 can also be provided with a metal layer as a cover layer 6. This layer can be applied either as an intermediate step during the etching process in order to control the progress of the material removal, for example the cone angle α, or after completion of the etching method for producing a desired product, such as an electron gun.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

1 Glass substrate
2 Outer surface
3 Outer surface
4 Laser modification
5 Recess
6 Cover layer
7 Rear side T Depression
d, D Size
h Height
α Cone angle

The invention claimed is:

1. A method for producing microstructures in a glass substrate, the method comprising:

introducing modifications by a laser beam into at least one volume between two opposite outer surfaces of the glass substrate;

after introducing the modifications, carrying out an etching method which provides anisotropic material removal in at least one of the two outer surfaces so as to produce a plurality of recesses that are cone-shaped at least in sections; and after carrying out the etching method, applying a layer that is resistant to an etching effect of the etching method as a cover layer in a region that includes at least individual ones of the recesses to only one of the two outer surfaces as a first outer surface; and after applying the layer that is resistant to the etching effect of the etching method, carrying out a further etching method of the glass substrate so that material is removed in the other one of the two outer surfaces as a second outer surface facing away from the cover layer until recesses of the second outer surface, which are produced by the further etching method and/or are produced by the etching method and are enlarged by the further etching method, have reached the cover layer.

2. The method according to claim 1, wherein the second outer surface is removed by etching in such a way that the cover layer of the first outer surface projects from a remaining plane of the second outer surface.

3. The method according to claim 1, wherein the cover layer is applied from an electrically-conductive material composition.

4. The method according to claim 1, further comprising applying a cover layer to the second outer surface.

5. The method according to claim 1, further comprising applying a cover layer to the second outer surface after the recesses in the second outer surface have reached the cover layer of the first outer surface as a result of progressive material removal.

6. The method according to claim 1, wherein a cone angle of the recesses is adjusted by the cover layer of the first outer surface and/or by laser parameters.

7. The method according to claim 1, wherein the cover layer is applied to the first outer surface and/or a cover layer is applied to the second outer surface only in at least one subregion of the glass substrate.

8. The method according to claim 1, wherein the modifications are introduced into the a least one volume between the two outer surfaces from one side by a plurality of laser beams connecting the two outer surfaces.

9. The method according to claim 1, wherein the modifications are introduced by the laser beam with a beam axis perpendicular to the a respective one of the outer surfaces of the glass substrate facing the laser beam.

10. The method according to claim 1, wherein the cover layer is reinforced with an additional functional layer.

11. The method according to claim 1, wherein a focus of the laser beam relative to the glass substrate does not change while the modifications are introduced.

12. The method according to claim 1, wherein the modifications are produced by a group of individual pulses, and wherein a focus of the laser beam relative to the glass substrate does not change for a duration of the group of individual pulses.

13. The method according to claim 12, wherein the individual pulses of a same group of the individual pulses are introduced into the glass substrate at a time interval of less than 1 μs.

14. The method according to claim 12, wherein a time interval between two successive groups of individual pulses is greater than a time interval between the individual pulses within one of the groups of individual pulses.

* * * * *